(12) United States Patent
Link

(10) Patent No.: US 6,409,083 B1
(45) Date of Patent: Jun. 25, 2002

(54) SAFETY SWITCH

(75) Inventor: Walter Link, Rutesheim (DE)

(73) Assignee: Euchner GmbH & Co., Leinfelden-Echterdingen (DE)

(*) Notice: Subject to any disclaimer, the term of this patent is extended or adjusted under 35 U.S.C. 154(b) by 0 days.

(21) Appl. No.: 09/319,042

(22) PCT Filed: Dec. 24, 1997

(86) PCT No.: PCT/EP97/07302

§ 371 (c)(1),
(2), (4) Date: Jun. 1, 1999

(87) PCT Pub. No.: WO98/43351

PCT Pub. Date: Oct. 1, 1998

(51) Int. Cl.[7] .................................................. G06K 7/08
(52) U.S. Cl. ...................................................... 235/449
(58) Field of Search ....................... 235/449; 340/825.31, 340/825.29, 825.61, 825.1

(56) References Cited

U.S. PATENT DOCUMENTS 4,973,958 A * 11/1990 Hirano ................... 340/825.69
5,134,392 A * 7/1992 Takeuchi et al. ....... 340/825.69
6,002,341 A * 12/1999 Ohta et al. ............. 340/825.31
6,043,752 A * 3/2000 Hisada et al. .......... 340/825.31
6,243,004 B1 * 6/2001 Flick ........................... 340/426

FOREIGN PATENT DOCUMENTS

JP 9-37475 * 2/1997

* cited by examiner

Primary Examiner—Michael G. Lee
Assistant Examiner—Allyson Sanders
(74) Attorney, Agent, or Firm—Roylance, Abrams, Berdo & Goodman, L.L.P.

(57) ABSTRACT

A safety switch for monitoring movable protection devices comprises a switching member with at least one reading head, and an actuating element which can be moved in relation the reading head. The actuating element engages in contactless interaction with the reading head. The actuating element has an inductive reactance for interaction with the reading head.

15 Claims, 3 Drawing Sheets

SAFETY SWITCH

FIELD OF THE INVENTION

The present invention relates to a safety switch for monitoring movable protection devices having a switching member with a reading head and having an actuating element movable relative to the reading head and co-operating with the reading head in a contactless manner.

BACKGROUND OF THE INVENTION

Movable protection devices in the configuration of doors and coverings on machines and processing plants are monitored with safety switches. The protection devices separate persons and machines form one another for the protection of both. For this purpose, during opening of doors or coverings, the safety switch must safely interrupt one or more current circuits and hold them disconnected until the protection device is closed again.

Electrical/mechanical safety switches for this purpose have a switching member connected with the stationary part of the protection device, into which can be introduced a separate operation control arrangement connected with the movable protection device. The separate operation control arrangement in the introduced state closes the switch contacts. When the protection device is opened, in other words without the operation control arrangement being introduced, the switch contacts are forcibly opened by a form-locking arrangement transferring the energy.

In those cases of use in which electrical/mechanical safety switches cannot be used because the environment is of extraordinary hygienic or other environmental conditions (foodstuffs processing, purification plants), operation control s with several permanent magnets are used. The magnets interact with reading heads without contact. Coils are provided in the reading heads. For safety reasons, at least three magnets must be provided. As opposed to electrical/mechanical safety switches, magnetic safety switches are considerably more sensitive in the case of vibrations. Additionally, when a breakdown occurs the preferred reaction is that the switch not be opened.

SUMMARY OF THE INVENTION

Objects of the present invention are to provide an improved safety switch for movable protection devices. These objects are attained according to the present invention by a safety switch for monitoring movable protection devices, comprising a switching member having at least one reading head, and an operation actuating element movable relative to the reading head and interacting with the reading head without contacting the reading head. The actuating element has an inductive reactance for interacting with the reading head and an electronic code in a first storage specifically identifying the actuating element. An evaluation device is connected at an output of the reading head, includes an electronic code in at least two second storages specifically identifying one of the reading head and the switching member, and includes at least two sets of components for analyzing and evaluating signals from the reading head.

Since the actuating element for interaction with the reading head has an inductive reactance, permanent magnets of any sort are no longer required in the operation control mechanism. The safety switch is thus insensitive to vibrations. At the same time, the problem of the magnets having an extended operation range, creating a disruptive effect when the mechanism is moved to either side, is also overcome. Upon breakdown of the inductive reactance of the reading head, no existence of an actuating element can be established. Thus, the safety switch then switches over into the safe state, in other words into opened state. When that occurs an inductive reactance offers greater safety than the device using three permanent magnets. As a result of the relatively extensive mechanical tolerances between actuating element and reading head, use of the safety switch according to the present invention is possible even in the case of heavy protection doors.

The reading head likewise advantageously has an inductive reactance which interacts over a magnetic alternating field with the inductive reactance of the actuating element. The two inductive reactances then form a transformer. This transformer can be operated under the safety technology principle of dynamic signal transmission. This allows for operation even with very high safety requirements using a structure having one single channel. The production of the reading head is greatly simplified and is of considerably lower cost.

It is especially advantageous when the actuating element picks up or absorbs its energy for operation from this magnetic alternating field. No separate voltage supply is required for the actuating element. Thus, the probability of a technical breakdown of the inductive reactance (with the resultant switching of the safety switch setting into the opened state) is greatly decreased. Also, the corresponding maintenance costs of the operation control are greatly decreased.

It is advantageous when the actuating element includes an electronic coding in a storage area, which specifically identifies the actuating element. Each actuating element is then a unique element. Any manipulations of the safety switch with the aid of another actuating element are precluded. At the same time, digital analysis/evaluation is possible instead of analog analysis/evaluation over a frequency shift. Similar actuating elements are used for identification systems in which movable ramming or tamping tools or ramming or tamping tool pallets carry such actuating element, which is detected by graphics- or registration-reading heads, and thereafter, is suitably programmed in order to supply instructions and/or feedback to a machine for the movement or transport of these parts.

When an analysis and evaluation device is series-connected at the outlet side on the reading head, which reading head includes an electronic coding in at least one further storage, specifically identifying the reading head or the switching member, each safety switch is also a unique element. In combination with a specifically identifiable actuating element, each individual safety switch reacts only to the signal from one single actuating element. For this purpose it is preferred that a comparison device be provided within the analysis/evaluation device. The comparison device compares the coding coming out of the actuating element with the stored coding of the same. Preferably, the coding coming form the actuating element for inducement of the operation of the reading head is read and picked up by the latter. Similar systems which are called transponders can also be used for the electronic automatic travel stop devices of automobiles, for example, in connection with ignition keys.

Because of the high safety level of the actuating element-reading head-system, it suffices for this arrangement to be configured with only one channel. On account of high sensitivity of the analysis/evaluation electronics, it is advantageous for the information flow to occur in two channels in the analysis/evaluation device. This is attained when at least twice as many parts of the analyzing/evaluating device, which are competent and authorized for the customary analysis/evaluation of the signal picked up from the reading head, are present.

Using a reliable technique, the safety switch has a key-like operation control which can be introduced into the housing of the switching member. One arrangement for use of the present invention is when the actuating element is provided mounted on the operation control, while correspondingly the reading head is provided within the housing of the switching member. An interchangeable arrangement however would also be conceivable. With use of known technology, the operation control is interlocked by use of a ramming or tamping rod. Another use of the present invention is with the actuating element mounted on the ramming or tamping rod, and with the reading head arranged within the housing of the switching member. Also, the arrangements could be suitably interchanged.

Because of the cost of material, it can be advantageous that the operating control be configured of plastic rather than metal. One advantageous protection against fault or error function as a result of a break of the operation control is obtained when one winding of the inductive reactance of the actuating element extends over almost the entire length of the operation control.

Other objects, advantages and salient features of the present invention will become apparent form the following detailed description, which, taken in conjunction with the annexed drawings, discloses a preferred embodiment of the present invention.

BRIEF DESCRIPTION OF THE DRAWINGS

Referring to the drawings which form a part of this disclosure.

DETAILED DESCRIPTION OF THE INVENTION

Figure 1:
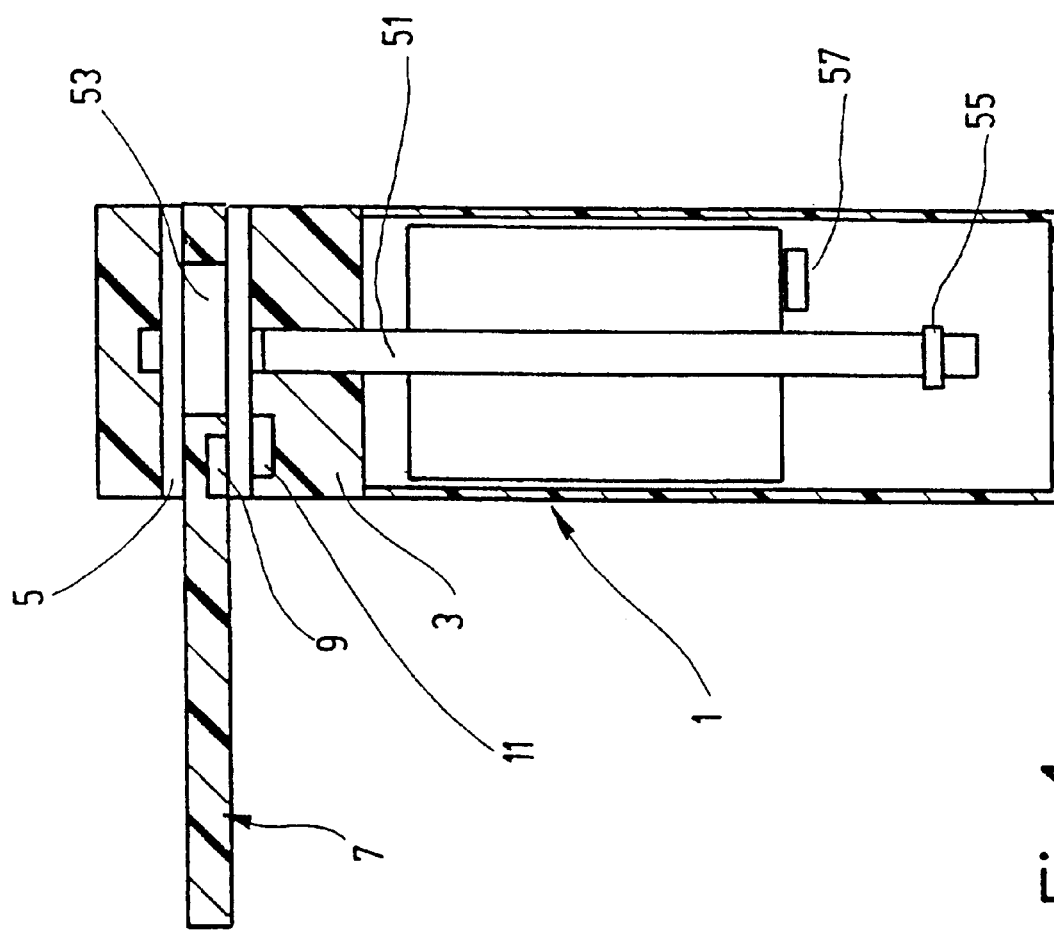
FIG. 1 is a side elevational view in section of a safety switch according to an embodiment of the present invention.
Figure 2:
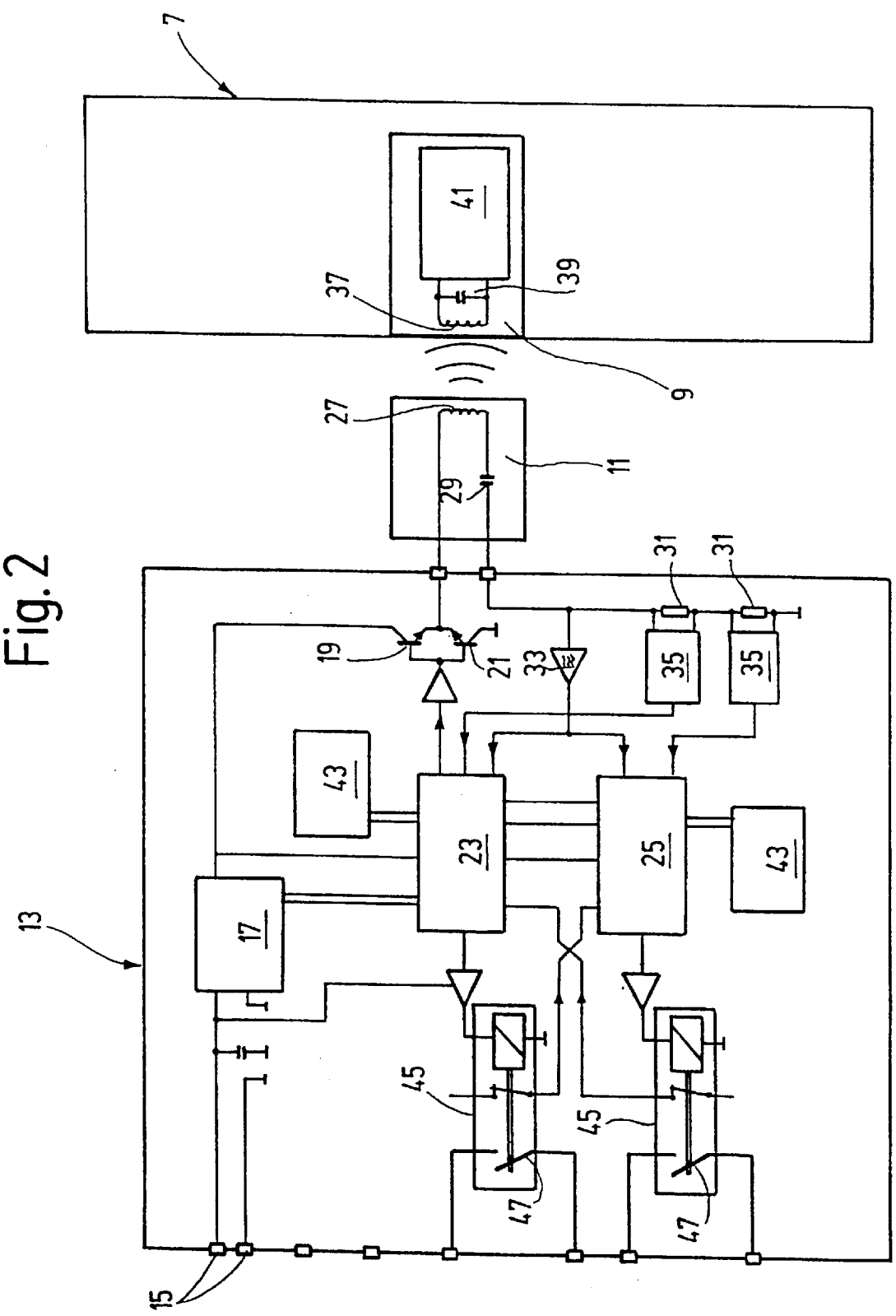
FIG. 2 is a schematic or wiring diagram of the operation control reading head and analysis/evaluation device of the safety switch of FIG. 1.
Figure 3:
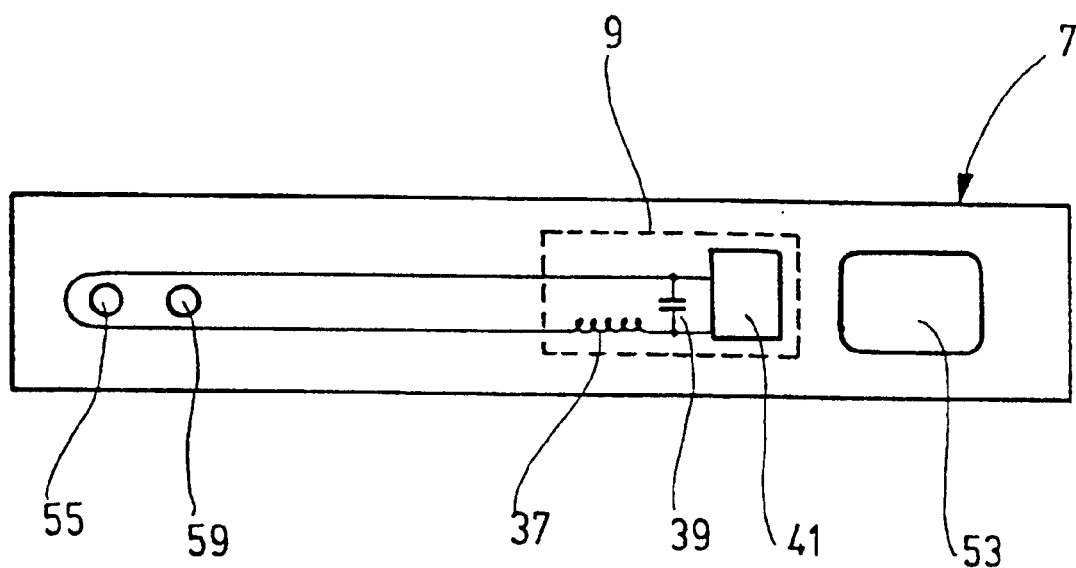
FIG. 3 is a diagram of the operation control.

A safety switch according to the present invention comprises a switching member 1 with a housing 3, which can be connected with the stationary part of a protection device. An operation control channel 5 passes all the way through the frontal area of housing 3. The channel is open at both ends. A key-like operation control member or actuator 7 can be introduced into operation control channel 5, and can be fastened to the mobile or movable part of a protection device, for example to a door or hood member. Operation control member 7 carries an actuating element 9 encased in plastic. Actuating element 9 is located within operation control channel 5 when operation control member 7 is introduced completely into operation control channel 5. Switching member 1 has a reading head 11 on the border or periphery of operation control 5. When operation control member 7 is completely introduced, actuating element 9 and reading head 11 are arranged opposite one another and can interact alternately with one another.

Reading head 11 is connected to an analysis and evaluation device 13. Analysis/evaluation device 13 has connections 15 fed an apparatus supply voltage of 24 V. The inputs of a control 17 are connected with these connections 15. The output of control 17 discharges an internal supply voltage of 5 V to the collector of an npn transistor 19 connected thereto. The output of transistor 19 is connected to a pnp transistor 21, as well as to a first microprocessor 23 and, for safety reasons, a second microprocessor 25. First microprocessor 23 is monitored over an additional control line from control 17. An output from first microprocessor 23 is connected over an amplifier to the bases of transistors 19 and 21. While the collector of the pnp transistor 21 is grounded, a conductor extends from and connects the two emitters of transistors 19 and 21 with one another, and extends into reading head 11 where it is connected to a coil or inductor 27. This coil 27 is arranged within reading head 11 on the side facing operation control channel 5, and extends with its longitudinal axis parallel thereto. A capacitor 29 is connected at the output of coil 27, which capacitor in turn is grounded over two resistances 31, and, on the other hand, is connected over a receiver amplifier 33 with band-pass filters to one input of each of the two microprocessors 23 and 25. For reasons of safety, parallel to each of the two resistances 31, one transmission level monitor 35 is connected in turn. One transmission level monitor is connected to an input of first microprocessor 23, while the other transmission level monitor is connected to an input of second microprocessor 25.

First microprocessor 23 generates from the computer circuit a frequency of 125 kHz, with which it controls both transistors 19 and 21, which switch alternately from locked or blocked into saturated state. By means of this circuit, the oscillation circuit of coil 27 and capacitor 29, of which the resonance frequency is likewise 125 kHz, is induced to oscillate. Coil 27 thus radiates a magnetic alternating field. Resistances 31 limit the current in the oscillation circuit, and thus, the amplitude of the magnetic alternating field. At the same time, the distance between operation actuation element 9 and reading head 11 is also established, at such a distance that the two members can continue to interact. Since twice as many resistances 31, as their customary number, are present, the transmission level monitors 35 by comparison can recognize a drift of one of the resistances 31.

An operation control coil or inductor 37 is provided in actuating element 9 as the inductive reactance. The coil is arranged on the side of actuating element 9 facing reading head 11 in longitudinal alignment along operation control member 7. Operation control coil 37 together with an operation control capacitor 39 forms an oscillation circuit. An IC building block 41 lies parallel to control capacitor 39. When operation control member 7 is completely introduced, actuating element 9 and reading head 11 are arranged opposite one another, and coil 27 and operation control coil 37 together form a transformer. In other words, a transmitter and transducer arrangement is formed. Since a gap is found between the two coils 27 and 37, the transformer has only a small degree of coupling (typically between 0.01 and 0.1). The magnetic alternating field being radiated from coil 27 induces a voltage in operation control coil 37, and with that excites oscillations in oscillation circuit 37 and 39. The IC building block 41 includes a converter, whereupon it can absorb or pick up energy from oscillation circuit 37 and 39. Furthermore, IC building block 41 has an EEPROM, which supplies a 32-bit lengthwise code, with which actuating element 9 is specifically identifiable. The IC building block 41 with this code modulates the amplitude in oscillating circuit 37 and 39 with a rate of 1 bit per msec. Operation control coil 37, determining a new course, joins back onto coil 27 in reading head 11, whereupon its oscillation circuit 37 and 39 is likewise modulated. This modulated signal is fed through receiver-amplifier 33 to microprocessors 23 and 25.

Each of the two microprocessors 23 and 25 has an EEPROM 43, in which is supplied a 32-bit lengthwise code with which reading head 11 is specifically identifiable. The two microprocessors 23 and 25 independent of one another determine whether a code is transmitted form actuating element 9 at all, and whether this code adapts to that code out of the EEPROM 43, in other words whether the pair made up of actuating element 9 and reading head 11 associated with one another is arranged with the elements of the pair facing one another. Only when the pair is in alignment does microprocessor 23 or 25 discharge the signal over an amplifier to a relay 45, for the closing of a switch 47. For greater safety then, opening contacts and line are provided for the closing of the switch 47, with which each microprocessor 23 and 25 can determine the switching state of the relevant other relay 45. The two switches 47 form the outputs of the safety switch, and for example, can be arranged connected in series thereto, to control the voltage feed into the machine provided with the protection device. If the distance between actuating element 9 and reading head 11 is too great, in other words for example when operation control member 7 is not introduced into operation control channel 5 (in other words when the protection device is open), microprocessors 23 or 25 can determine no fitting code, so that microprocessors 23 and 25 give the signal for the opening of switch 47, and thus, for disconnection of the voltage feed to the machine.

To increase safety, switching member 1 has a ramming or tamping tool 51 slidable longitudinally in housing 3, and configured preferably as an armature of a lifting magnet. Ramming or tamping tool 51 can pass crosswise through operation control channel 5, extending perpendicular to the tool direction of movement, and engage on the opposite side in a cutout in housing 3. Operation control member 7 includes an opening 53 through which ramming or tamping tool or slide 51 can engage when operation control member 7 is introduced completely into operation control channel 5. Ramming or tamping tool 51 is spring-biased counter to the lift direction of the magnet. The arrangement and control of the lift magnet is thus determined so that with operation control member 7 arranged inserted completely in operation control channel 5, ramming or tamping tool 51, passing through opening 53, engages in the cutout in the head of housing 3 and locks down operation control member 7. Thus ramming or tamping tool 51 frees operation control member 7 only following disconnection of the machine, when the machine has come to a standstill, so that the protection device cannot be opened while the machine is still running. To monitor the position of ramming or tamping tool 51, this arrangement also includes another actuating element 55, configured identical to actuating element 9. Furthermore, switching member 1 in housing 3 has another reading head 57, which is configured identical to reading head 11. The additional actuating element 55 and the additional reading head 57 are thus arranged so that they lie opposite one another when ramming or tamping tool 51 locks down actuating element 7. The other analysis/evaluation device connected at the output of the other reading head 57 has two switches, preferably laid out in series with switch 47 of analysis/evaluation device 13.

Operation control member 7 is plastic. At the ends most distant from opening 53 are provided fastening apertures, with which operation control member 7 is fastened to the movable part of the protection device. A copper wire winding of operation control coil 37 extends outward form actuating element 9 to operation control member 7, around the fastening apertures 59 and back to actuating element 9. The winding can also be laid again around opening 53. when there is an interruption of operation control member 7, this winding and with it operation control coil 37 are disconnected, so that actuating element 9 can no longer operate on the magnetic alternating field of reading head 11. In this case it is signaled to the switching member 1 that the protection device is open, so that the safety switch switches over into safety state, in other words the voltage supply to the machine is disconnected.

While an embodiment has been chosen to illustrate the invention, it will be understood by those skilled in the art that various changes and modifications can be made therein without departing from the scope of the invention as defined in the appended claims.

What is claimed is:

1. A safety switch for monitoring movable protection devices, comprising:

a switching member having at least one reading head;

an operation actuating element movable relative to said reading head and interacting with said reading head without contacting said reading head, said actuating element having an inductive reactance for interacting with said reading head and an electronic code in a first storage specifically identifying said actuating element; and an evaluation device connected at an output of said reading head, including an electronic code in at least two second storages specifically identifying one of said reading head and said switching member, and including at least two sets of components for analyzing and evaluating signals from said reading head.

2. A safety switch according to claim 1 wherein said reading head comprises an inductive reactance interacting over a magnetic alternating field with an inductive reactance of said actuating element.

3. A safety switch according to claim 2 wherein said actuating element reserves energy for operation thereof from said magnetic alternating field.

4. A safety switch according to claim 1 wherein said evaluation device comprises at least one comparison device for comparing said code which is emitted by said actuating element when said reading head is stimulated and which is received by said reading head with said code stored in said evaluation device.

5. A safety switch according to claim 1 wherein said switching member comprises a housing; and an actuator is receivable in said housing.

6. A safety switch according to claim 5 wherein said actuating element is provided on said actuator.

7. A safety switch according to claim 3 wherein said actuating element is provided on a slide which locks said actuator.

8. A safety switch according to claim 3 wherein at least one winding of said inductive reactance of said actuating element extends over nearly an entire length of said actuator.

9. A safety switch according to claim 1 wherein the safety switch is coupled to a machine as a protection device.

10. A safety switch according to claim 1 wherein the safety switch is coupled to an installation as a protection device.

11. A safety switch according to claim 1 wherein each of said sets of components comprises a comparison device, connected to the respective second storage, for comparing said code which is emitted when said actuating element is stimulated and which is received by said reading head with said code stored in the respective second storage.

12. A safety switch according to claim 11 wherein said comparison devices are microprocessors.

13. A safety switch according to claim 11 wherein each of said sets of components comprises a level monitor connected to the respective comparison device.

14. A safety switch according to claim 11 wherein each said comparison device is connected to a relay operatively coupled to a switch controlling power to a machine coupled thereto.

15. A safety switch according to claim 1 wherein said evaluation device is connected to at least one relay operatively coupled to a switch controlling power to a machine coupled thereto.

* * * * *